United States Patent
Takada

(10) Patent No.: US 7,805,646 B2
(45) Date of Patent: Sep. 28, 2010

(54) LSI INTERNAL SIGNAL OBSERVING CIRCUIT

(75) Inventor: Shuichi Takada, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 951 days.

(21) Appl. No.: 11/415,584

(22) Filed: May 1, 2006

(65) Prior Publication Data

US 2006/0255661 A1 Nov. 16, 2006

(30) Foreign Application Priority Data

May 10, 2005 (JP) .............................. 2005-137391

(51) Int. Cl.
*G01R 31/3177* (2006.01)
*G01R 31/307* (2006.01)

(52) U.S. Cl. ....................... 714/724; 714/734

(58) Field of Classification Search ........................ None
See application file for complete search history.

(56) References Cited

U.S. PATENT DOCUMENTS

| | | | | |
|---|---|---|---|---|
| 4,301,383 A | * | 11/1981 | Taylor | 327/437 |
| 5,220,483 A | * | 6/1993 | Scott | 361/313 |
| 5,754,066 A | * | 5/1998 | Smith | 327/108 |
| 6,002,287 A | * | 12/1999 | Ueno et al. | 327/307 |
| 2004/0075174 A1 | * | 4/2004 | Tamaru et al. | 257/758 |
| 2005/0041482 A1 | * | 2/2005 | Tomishima | 365/189.11 |

FOREIGN PATENT DOCUMENTS

| | | | |
|---|---|---|---|
| JP | 06274241 A | * | 9/1994 |
| JP | 10-107211 | | 10/1996 |
| JP | 11-044724 | | 7/1997 |
| JP | 2000-134082 | | 10/1998 |
| JP | 2001-091596 | | 9/1999 |

* cited by examiner

*Primary Examiner*—Kevin L Ellis
*Assistant Examiner*—Dipakkumar Gandhi
(74) *Attorney, Agent, or Firm*—DLA Piper LLP (US)

(57) ABSTRACT

An LSI internal signal observing circuit includes a pad; a monitor line connected to the pad and wired inside an LSI; a shield line wired adjacent to the monitor line and having a fixed potential; a buffer having an output enable terminal and connected to an internal node in the LSI; and a capacitor connected between an output of the buffer and the monitor line, wherein an output enable signal input to the enable terminal is controlled to set the buffer in an output enable state, and a change of a signal at the internal node is superposed on the monitor line through the capacitor and observed at the pad.

20 Claims, 4 Drawing Sheets

E1, E2, En: ENABLE SIGNAL
S1, S21, S22, Sn: OUTPUT SIGNAL LINE
C1, C21, C22, Cn: CAPACITOR

LSI INTERNAL SIGNAL OBSERVING CIRCUIT

CROSS-REFERENCE TO RELATED APPLICATION

This application is based upon and claims the benefit of priority from the prior Japanese Patent Applications No. 2005-137391, filed on May 10, 2005, the entire contents of which is incorporated herein by reference.

BACKGROUND OF THE INVENTION

1. Field of the Invention

The present invention relates to an LSI internal signal observing circuit and, for example, to an LSI internal signal observing circuit which can easily observe a change in high-speed signal in an LSI at a pad of the LSI.

2. Related Art

As one of test methods which improve failure detection rate of an LSI (Large-Scale Integrated circuit), a method of improving observability to make it possible that an output in the circuit in test can be monitored outside the LSI. In order to perform such monitoring, there is proposed a test facilitating circuit in which a multiplexer and an output buffer for test are arranged to observe a desired internal signal in the LSI via a pad for test (for example, see Japanese Patent Laid-Open No. 10-107211 (page 3 and FIG. 1).

However, with an increase in speed of an internal signal, a normal output signal does not have been able to obtained from a conventional output buffer, because the conventional output buffer outputs a signal having an amplitude which is so large to follow a high-speed operation. As one of methods which avoid the problem, a method of using an output circuit of a small signal differential amplitude (LVDS: Low-Voltage Differential Signaling) scheme which can operate an output signal with a small amplitude is proposed (for example, see Japanese Patent Laid-Open No. 2000-134082 (pp. 3 to 4 and FIG. 1)).

However, the output circuit of the LVDS scheme disadvantageously has a complex circuit configuration and a large circuit scale. In addition, use of the special output circuit in only a test deteriorates efficiency in the use of the chip area of an LSI.

SUMMARY OF THE INVENTION

An LSI internal signal observing circuit according to an embodiment of the invention comprises a pad; a monitor line connected to the pad and wired inside an LSI; a shield line wired adjacent to the monitor line and having a fixed potential; a buffer having an output enable terminal and connected to an internal node in the LSI; and a capacitor connected between an output of the buffer and the monitor line, wherein an output enable signal input to the enable terminal is controlled to set the buffer in an output enable state, and a change of a signal at the internal node is superposed on the monitor line through the capacitor and observed at the pad.

An LSI internal signal observing circuit according to an other embodiment of the invention comprises a pad; a monitor line connected to the pad and wired inside in an LSI; a shield line arranged adjacent to the monitor line and having a fixed potential; a plurality of buffers having output enable terminals and connected to a plurality of nodes of the internal circuit, respectively; and a plurality of capacitors connected between output terminals of the plurality of buffers and the monitor line, wherein enable signals input to the output enable terminals of the plurality of buffers are controlled to set any one of the plurality of buffers in an output enable signal, and a change of a signal at a desired node of the plurality of internal nodes is superposed on the monitor through the capacitor connected to the buffer set in the output enable state and observed at the pad.

DETAILED DESCRIPTION OF THE INVENTION

An embodiment of the present invention will be described below with reference to the accompanying drawings.

Figure 1:
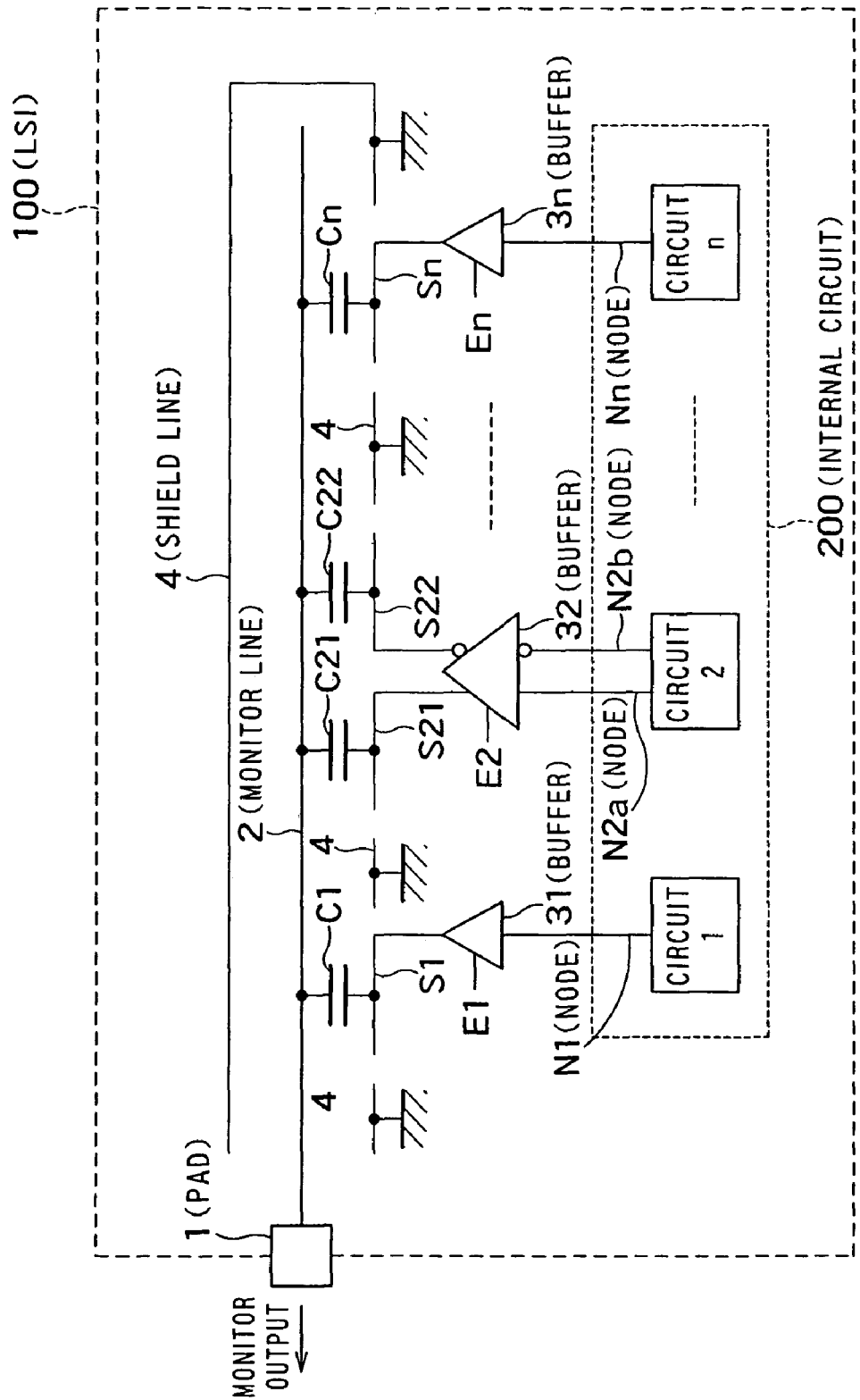
FIG. 1 is a circuit diagram showing an example of the configuration of an LSI internal signal observing circuit according to an embodiment of the present invention.

FIG. 1 is a circuit diagram showing an example of the configuration of an LSI internal signal observing circuit according to an embodiment of the present invention. The LSI internal signal observing circuit according to the embodiment is a circuit which outputs a change in level of a signal to be observed in an internal circuit 200 in a LSI 100 to a pad 1 arranged on an LSI 100 as a monitor output.

The LSI internal signal observing circuit according to the embodiment includes the pad 1, a monitor line 2 connected to the pad 1, buffers 31, 32, ..., 3n connected to nodes N1, N2, ..., Nn which output signals to be observed in the internal circuit 200, output signal lines S1, S21, S22, ..., Sn connected to the outputs of the buffers, respectively, capacitors C1, C21, C22, ..., Cn connected between the output signal lines and the monitor line 2, and a shield line 4 wired adjacent to the monitor line 2.

The monitor line 2 and the shield line 4 are made of wires of the same metal wiring layer of the LSI 100.

The shield line 4 is adjacent to the monitor line 2, arranged along the monitor line 2, and connected to a terminal of a fixed potential such as a ground potential or a power supply potential. In this manner, the shield line 4 plays a role of prevention of intrusion of noise (for example, crosstalk noise or the like) from a neighboring wire into the monitor line 2.

The buffers 31, 32, ..., 3n have enable terminals, respectively, and enable states of outputs from the buffers 31, 32, ..., 3n are controlled by enable signals E1, E2, ..., En input to the enable terminals of the buffers 31, 32, ..., 3n, respectively. The enable signals E1, E2, ..., En are controlled such that only one of the buffers 31, 32, ..., 3n is set in an enable state.

As the buffer, a unipolar-output buffer such as the buffer 31 or 3n can be used, or a differential-input bipolar-output buffer indicated as the buffer 32 can also be used. To the output of the bipolar-output buffer, a positive output and a negative output are simultaneously output.

The output signal lines S1, S21, S22, ..., Sn of metal wires are drawn from the output terminals of the buffers 31, 32, ..., 3n, respectively. More specifically, the output signal line S1 is drawn from the output terminal of the buffer 31, and the output lines S21 and S22 are drawn from the positive and negative output terminals of the buffer 32, and the output signal line Sn is drawn from the output terminal of the buffer 3n.

Wires constitute the output signal lines S1, S21, S22, ..., Sn are wired adjacent to the monitor line 2. In this manner, inter-wiring capacitors are generated between wires constituting the output signal lines S1, S21, S22, ..., Sn and the monitor line 2. The inter-wiring capacities are defined as capacitors C1, C21, C22, ..., Cn connected between the output signal lines S1, S21, S22, ..., Sn and the monitor line 2.

The capacitors C1, C21, C22, ..., Cn capacitively couple the output signal lines S1, S21, S22, ..., Sn to the monitor line 2. By the capacity coupling, only AC components of signals of the output signal lines S1, S21, S22, ..., Sn are transmitted to the monitor line 2. However, by the control of the enable signals E1, E2, ..., En, signals are not simultaneously output to two or more output signal lines. In other words, when a signal of one output signal line of the output signal lines S1, S21, S22, ..., Sn changes, the change is superposed on the monitor line 2.

More specifically, a change of a signal of a node (of the nodes N1, N2, ..., Nn in the internal circuit 200) connected to a buffer (any one of the buffers 31, 32, ..., 3n) set in an output enable state under the control of the enable signals E1, E2, ..., En is superposed on the monitor line 2.

The change of the signal of the node in the internal circuit 200 superposed on the monitor line 2 is output from the pad 1 as a monitor output.

In this case, in order to densify the capacitive coupling between the output signal lines S1, S21, S22, ..., Sn and the monitor line 2, the capacitances of the capacitors C1, C21, C22, ..., Cn must be increased.

Figure 2:
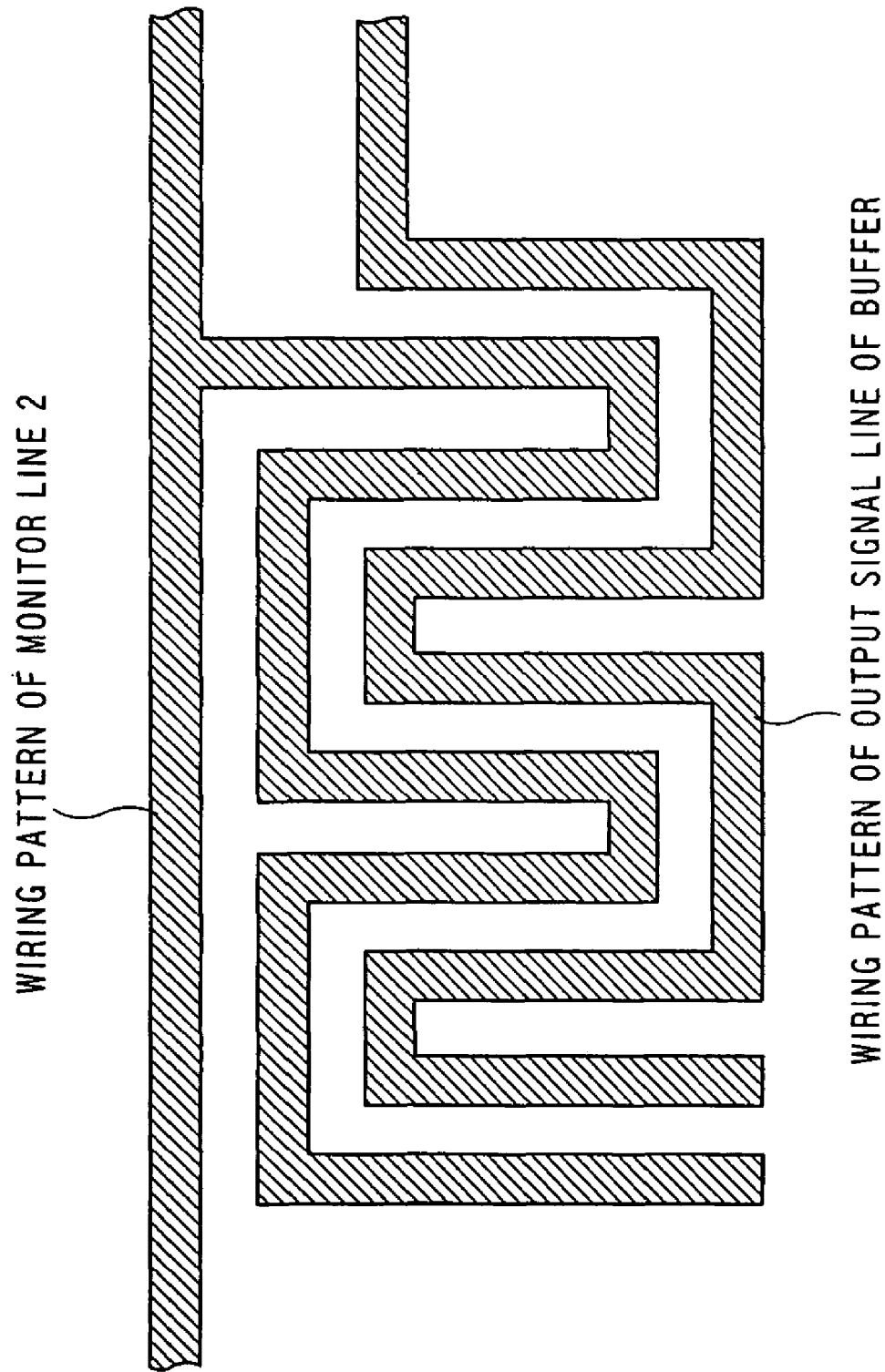
FIG. 2 is a pattern diagram showing examples of capacitors.
Figure 3A:
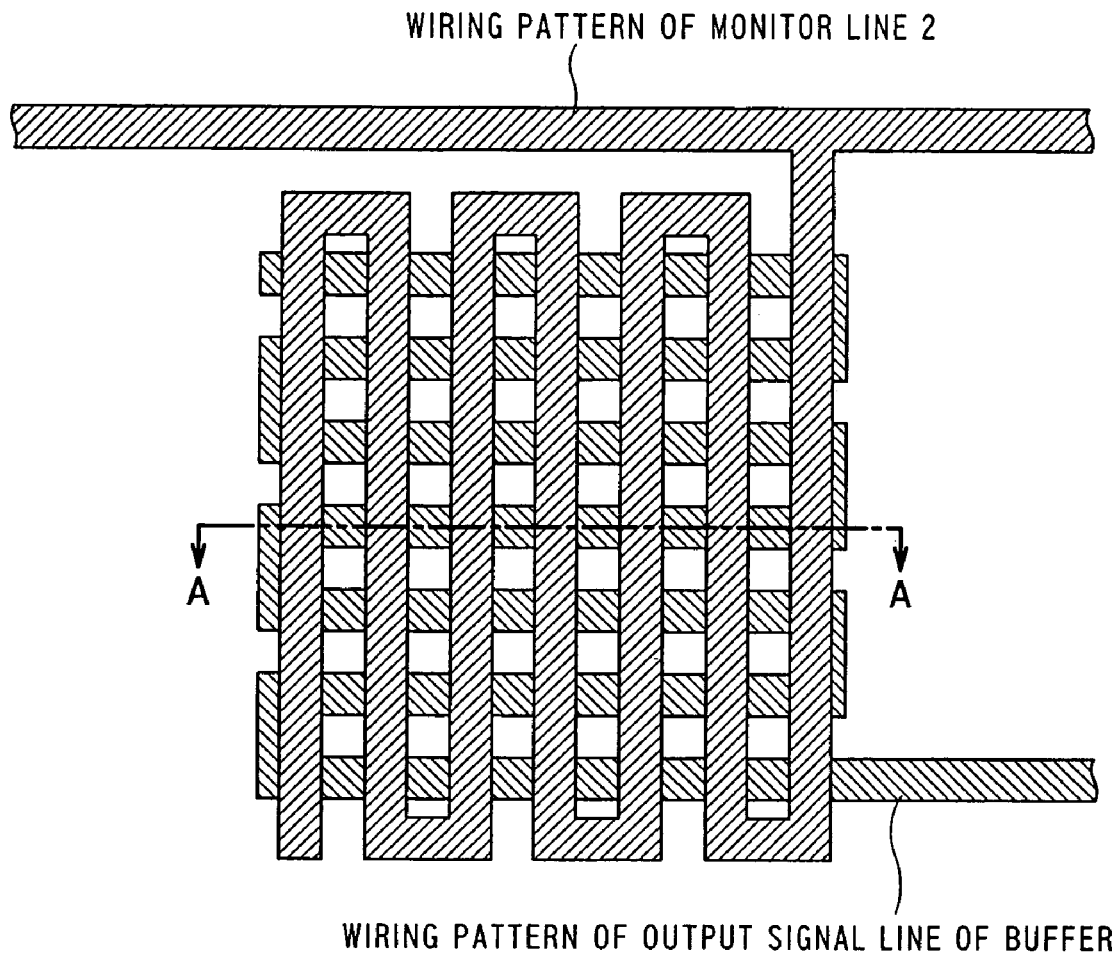
FIG. 3 is a pattern diagram showing examples of capacitors.
Figure 3B:
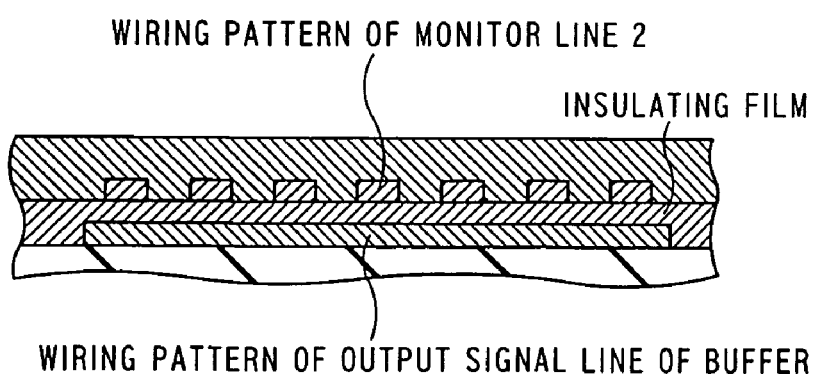

FIGS. 2, 3A, and 3B are wiring pattern diagrams showing examples of wire drawing to increase the capacitors between the output signal lines and the monitor line 2.

FIG. 2 is a wiring pattern plan diagram showing an example of a wiring pattern obtained when the output signal lines and the monitor line 2 are formed of the same metal wiring layer. When wiring intervals between the signal lines and the monitor line 2 decrease, or when the lengths of the output signal lines formed along the monitor line 2 increases, the capacitances of the capacitors increase.

FIGS. 3A and 3B are wiring pattern diagrams showing an example of a wiring pattern obtained when the output signal lines and the monitor line 2 are made of two metal wiring layers. FIG. 3A is a plan view, and FIG. 3B is a sectional view.

In this embodiment, an underlying wiring layer is used as the output signal lines, and a metal wiring layer immediately above the wiring layer is used as the monitor line 2. As a facing area between the output signal lines and the monitor line 2 increases, and as an insulating film between the output signal lines and the monitor line 2 decreases, the capacitance of the capacitor increases.

Figure 4:
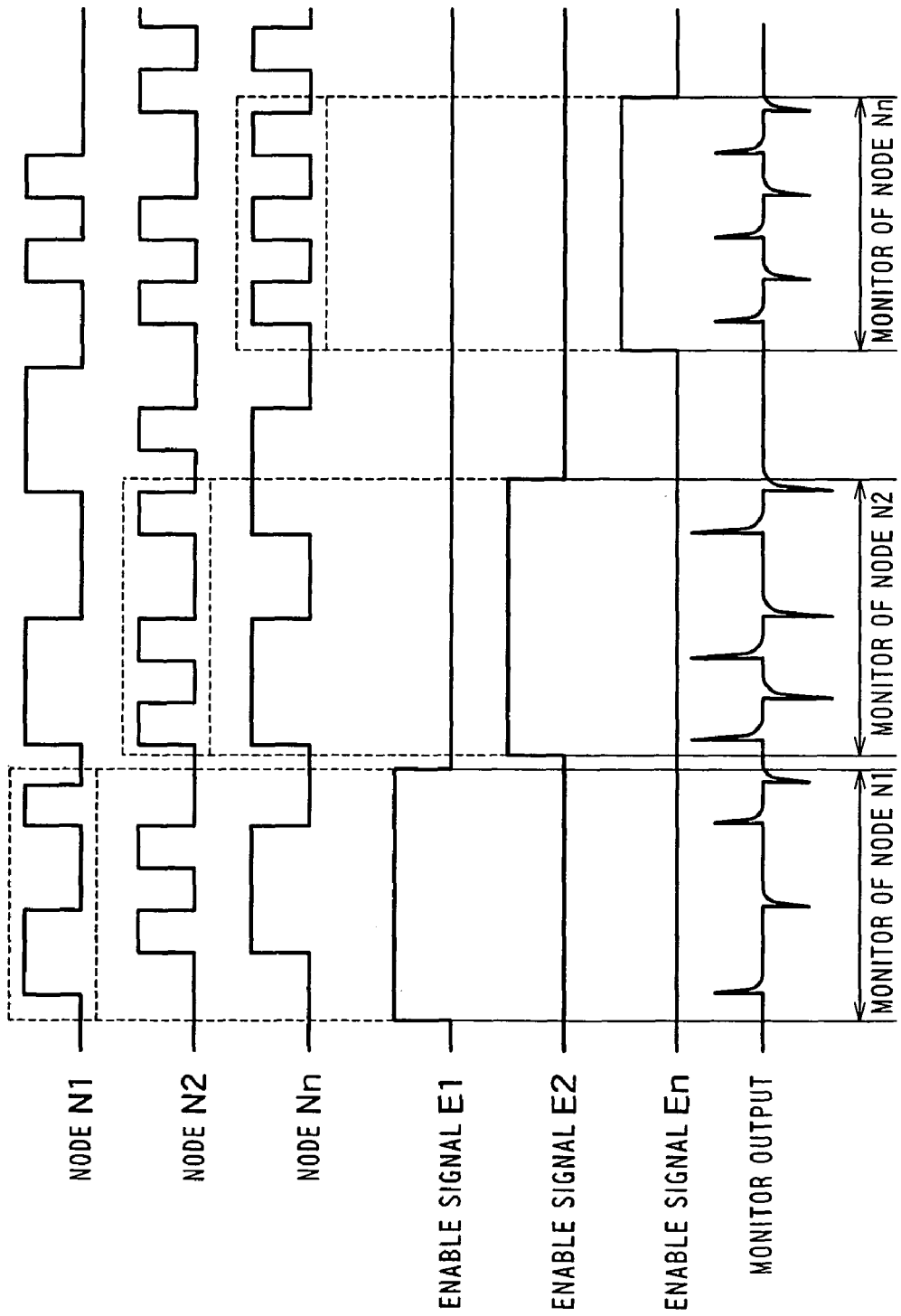
FIG. 4 is a waveform chart for explaining an operation of an LSI internal signal observing circuit according to the embodiment.

FIG. 4 is a waveform chart for explaining an operation of an LSI internal signal observing circuit according to the embodiment when changes of signals at the nodes N1, N2, ..., Nn in the internal circuit 200 of the LSI 100 are observed.

When a signal at a node A is observed, only the enable signal E1 is set at an active level. In this manner, a change of a signal at the node N1 output to the output signal line S1 of the buffer 31 is superposed on the monitor line 2 through the capacitor C1, and the superposed change is output to the pad 1 as a monitor output.

When a signal at a node N2 is observed, only the enable signal E2 is set at an active level. In this manner, changes of the signals at the node N2 output to the output signal lines S21 and S22 of the differential-input bipolar-output buffer 32 are superposed on the monitor line 2 through the capacitors C21 and C22. The superposed changes are output to the pad 1 as monitor outputs. At this time, the positive output of the output signal line S21 and the negative output of the output signal line S22 are multiplexed, and a change in level of the monitor line 2 increases.

Similarly, when a signal at the node Nn is observed, only the enable signal En is made active. In this manner, a change of a signal at a node N output to the output signal line S1 of the buffer 31 is superposed on the monitor line 2 through the capacitor C1. The superposed change is output to the pad 1 as a monitor output.

In this manner, in the LSI internal signal observing circuit according to the embodiment, a change of a signal at an arbitrary node in the internal circuit 200 can be observed by controlling the enable signal E1 to En. In general, since the impedance of a capacitor decreases as the frequency of a signal becomes high, even though the change of a signal at a node in the internal circuit has a high speed, the change is superposed on the monitor line 2, and the change can be observed at the pad 1.

According to the embodiment described above, a change of a signal which operates at a high speed in the LSI internal circuit can be observed at a pad arranged in the LSI by only arranging an output signal line and a monitor line constituted by a metal wiring layer without using a special circuit such as an output circuit of an LVDS scheme. For this reason, the chip area of an LSI can be prevented from being increased by forming a special circuit such as an output circuit of the LVDS scheme.

What is claimed is:

1. An LSI internal signal observing circuit comprising:
   a pad;
   a monitor line connected to the pad and wired inside an LSI;
   a shield line wired adjacent to the monitor line and having a fixed potential;
   a buffer having an output enable terminal and connected to an internal node in the LSI; and
   a capacitor connected between an output of the buffer and the monitor line, wherein an output enable signal input to the enable terminal is controlled to set the buffer in an output enable state, and a change of a signal at the internal node is superposed on the monitor line through the capacitor and observed at the pad.

2. The LSI internal signal observing circuit according to claim 1, wherein the capacitor is an inter-wire capacitor formed between the monitor line and an output signal line of the buffer drawn adjacent to the monitor line.

3. The LSI internal signal observing circuit according to claim 2, wherein the buffers are unipolar-output buffers.

4. The LSI internal signal observing circuit according to claim 2, wherein the buffers are bipolar-output buffers.

5. The LSI internal signal observing circuit according to claim 2, wherein the monitor line and the shield line are made of wires of the same metal wiring layer.

6. The LSI internal signal observing circuit according to claim 2, wherein the shield line is adjacent to the monitor line, arranged along the monitor line, and connected to a terminal of a ground potential or a terminal of a power supply potential.

7. The LSI internal signal observing circuit according to claim 1, wherein the buffers are unipolar-output buffers.

8. The LSI internal signal observing circuit according to claim 1, wherein the buffers are bipolar-output buffers.

9. The LSI internal signal observing circuit according to claim 1, wherein the monitor line and the shield line are made of wires of the same metal wiring layer.

10. The LSI internal signal observing circuit according to claim 1, wherein the shield line is adjacent to the monitor line, arranged along the monitor line, and connected to a terminal of a ground potential or a terminal of a power supply potential.

11. An LSI internal signal observing circuit comprising:
a pad;
a monitor line connected to the pad and wired inside in an LSI;
a shield line arranged adjacent to the monitor line and having a fixed potential;
a plurality of buffers having output enable terminals and connected to a plurality of nodes of the internal circuit, respectively; and
a plurality of capacitors connected between output terminals of the plurality of buffers and the monitor line, wherein enable signals input to the output enable terminals of the plurality of buffers are controlled to set any one of the plurality of buffers in an output enable state, and a change of a signal at a desired node of the plurality of internal nodes is superposed on the monitor line through the capacitor connected to the buffer set in the output enable state and observed at the pad.

12. The LSI internal signal observing circuit according to claim 11, wherein the capacitor is an inter-wire capacitor formed between the monitor line and an output signal line of the buffer drawn adjacent to the monitor line.

13. The LSI internal signal observing circuit according to claim 12, wherein the buffers are unipolar-output buffers.

14. The LSI internal signal observing circuit according to claim 12, wherein the buffers are bipolar-output buffers.

15. The LSI internal signal observing circuit according to claim 12, wherein the monitor line and the shield line are made of wires of the same metal wiring layer.

16. The LSI internal signal observing circuit according to claim 12, wherein the shield line is adjacent to the monitor line, arranged along the monitor line, and connected to a terminal of a ground potential or a terminal of a power supply potential.

17. The LSI internal signal observing circuit according to claim 11, wherein the buffers are unipolar-output buffers.

18. The LSI internal signal observing circuit according to claim 11, wherein the buffers are bipolar-output buffers.

19. The LSI internal signal observing circuit according to claim 11, wherein the monitor line and the shield line are made of wires of the same metal wiring layer.

20. The LSI internal signal observing circuit according to claim 11, wherein the shield line is adjacent to the monitor line, arranged along the monitor line, and connected to a terminal of a ground potential or a terminal of a power supply potential.

* * * * *